United States Patent [19]

Leichle

[11] 4,190,823

[45] Feb. 26, 1980

[54] INTERFACE UNIT FOR USE BETWEEN ANALOG SENSORS AND A MICROPROCESSOR

[75] Inventor: Claude Leichle, Le Pecq, France

[73] Assignee: Regie Nationale des Usines Renault, Boulogne-Billancourt, France

[21] Appl. No.: 868,448

[22] Filed: Jan. 10, 1978

[30] Foreign Application Priority Data

Jan. 11, 1977 [FR] France .............................. 77 00560

[51] Int. Cl.² .................... H03K 13/20; G06F 15/20
[52] U.S. Cl. ...................... 340/347 NT; 340/347 CC; 364/111; 364/835
[58] Field of Search .............................. 364/431, 424; 340/347 NT, 347 CC; 123/32 EB, 32 EE

[56] References Cited

U.S. PATENT DOCUMENTS

| | | | |
|---|---|---|---|
| 3,710,376 | 1/1973 | Fluegel | 340/347 CC |
| 3,737,893 | 6/1973 | Belet et al. | 340/347 NT |
| 3,820,109 | 6/1974 | Konrad et al. | 340/347 NT |
| 3,893,103 | 7/1975 | Prill | 340/347 NT |
| 3,909,601 | 9/1975 | Yamawaki et al. | 123/32 EB |
| 3,942,172 | 3/1976 | Tucker | 340/347 NT |
| 3,967,270 | 6/1976 | Anderson et al. | 340/347 NT |
| 4,050,065 | 9/1977 | Mosley et al. | 340/347 CC |
| 4,061,025 | 12/1977 | Willenbecher et al. | 364/424 |
| 4,072,850 | 2/1978 | McGlynn | 364/424 |

OTHER PUBLICATIONS

Mitchell: A Fast Analog Scanner for Data Acquisition on Nuclear Plants, GEC Journal of Science and Technology, vol. 43, No. I, 1976, pp. 37–47.

*Primary Examiner*—Felix D. Gruber
*Attorney, Agent, or Firm*—Fleit & Jacobson

[57] ABSTRACT

An improved interface circuit for use between variable voltage analog sensors which are measuring physical parameters and a microprocessor which is processing the data relating to such parameters. The interface unit is of the type employing an analog multiplexer, an analog to digital converter, a voltage to frequency converter, a counter for converting frequency to digital data, and a bus adapter for connection to the microprocessor. The inventive improvement relates to providing the multiplexer as a differential multiplexer having two differential voltage outputs and having a sign detector connected thereto. A switching block is connected between the differential voltage outputs and the voltage to frequency converter and also to the sign detector thereby acting as a selector circuit. The selector circuit passes each voltage output signal of the multiplexer which has a constant sign to the voltage to frequency converter, wherein the counter is an up-/down counter whose counting input is connected to the sign detector output.

9 Claims, 4 Drawing Figures

FIG_1

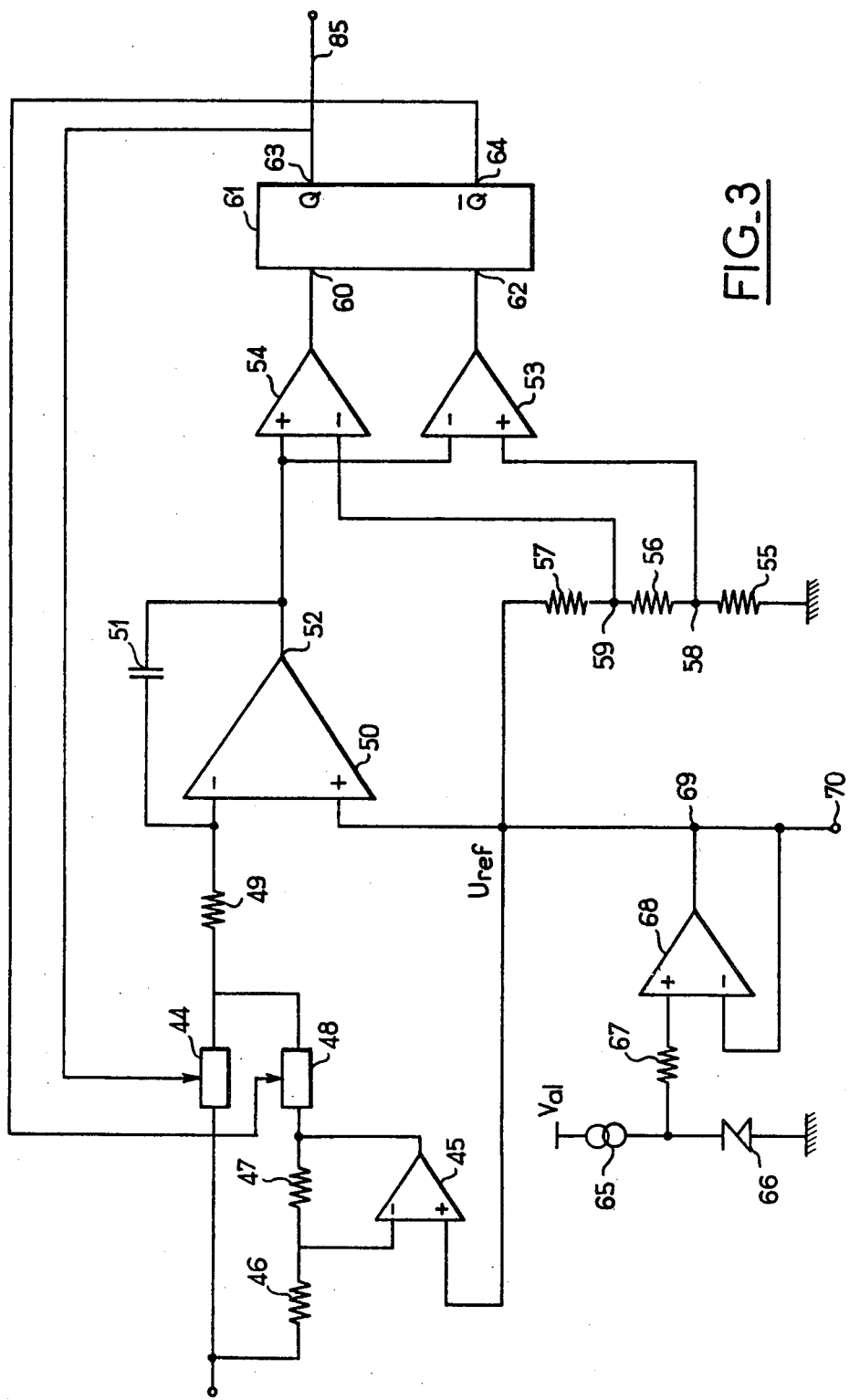
FIG_3

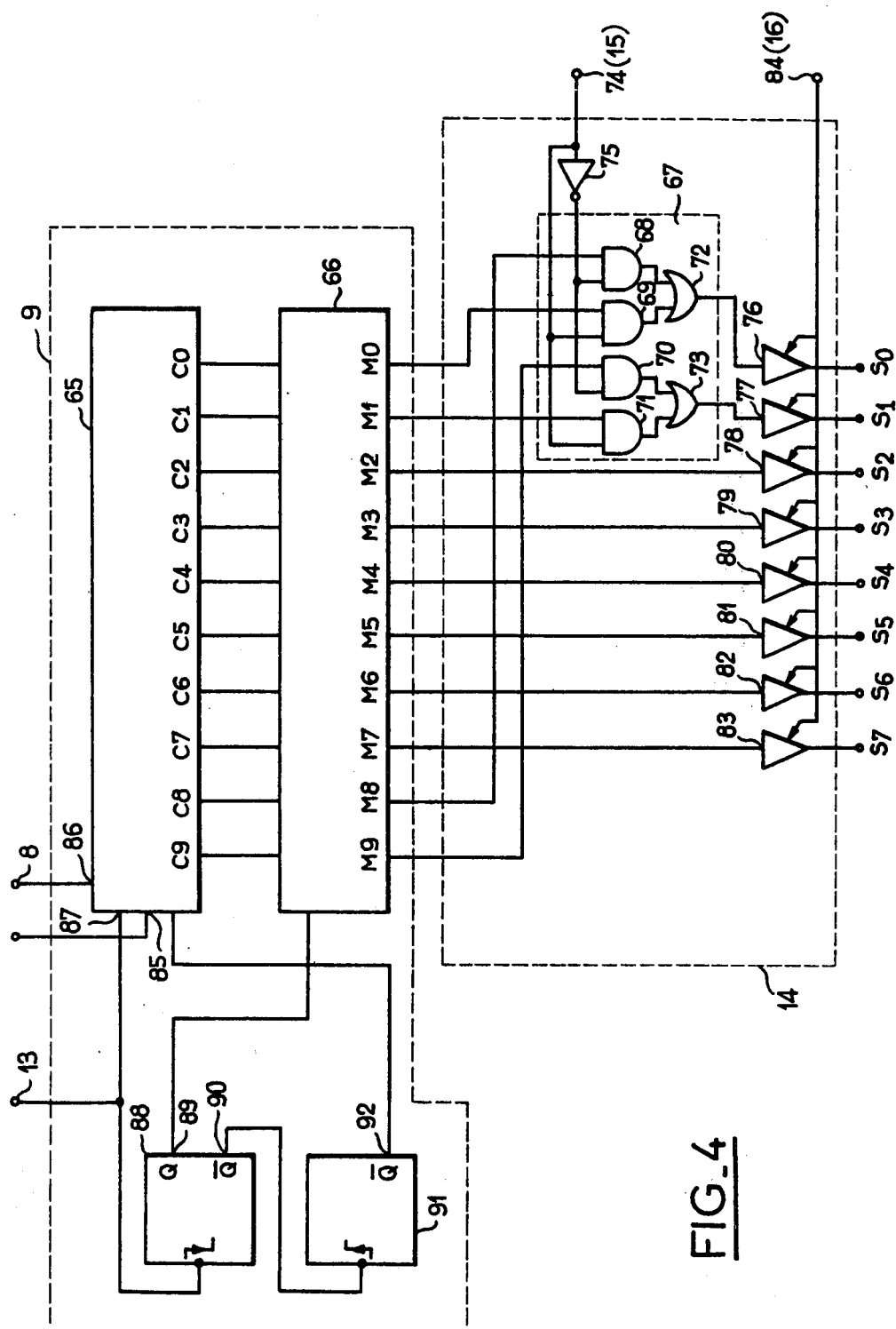
FIG_4

INTERFACE UNIT FOR USE BETWEEN ANALOG SENSORS AND A MICROPROCESSOR

The present invention relates to a device for obtaining interface analogue data between a micro-processor and the internal combustion engine of a motor vehicle.

Since the wide-spread diffusion of logic circuits, and still more since the diffusion of micro-processors, the analogue processing has been superseded by the processing of data in digital form. The reasons for these changes are obvious: on the one hand digital devices are reliable and accurate, and any shifts and errors due to the components themselves are safely avoided by the data quantification. On the other hand, digital techniques leading to highly repetitive circuits lend themselves particularly well to a large-scale integration and therefore to the production of low-cost-devices.

However, this superiority of digital data processing did not eliminate analogue components completely. In fact, all material phenomena occurring during the operation of an industrial process are essentially continuous phenomena. Therefore, in most instances the sensors utilized for measuring these data will deliver continuously variable voltages which, to permit the processing thereof in a digital manner, must be converted into binary magnitudes.

This analogue to digital conversion problem has already been approached in different ways, and devices referred to as data obtaining systems have already been proposed which are capable of taking into account one of a plurality of analogue inputs, with sampling during a very short time, and analogue-to-digital conversion. However, these known devices are generally very expensive and suitable only for problems requiring both precision and rapidity.

The new possibilities offered by micro-processors, i.e. the low-cost construction of compound computation, when applied to the control of an internal combustion engine, make it possible to solve the problems of pollution and energy consumption with which motor vehicle operators are confronted. Yet, also in this case the problem of converting analogue data into digital data has not been given any really satisfactory solution up to now. For several reasons, existing devices of this character are ill-suited. On the one hand their cost is high and the techniques implemented for this purpose are not in favour of a cost reduction in case of mass-production. On the other hand, these known devices are designed for operation from a plurality of power supply sources while on a motor vehicle only one source is available. Finally, they are designed for sampling analogue input values during a very short time before the conversion takes place, which is not by far the best solution for taking into account the rapidly variable data delivered by the sensors connected to the engine.

In view of the foregoing, the present invention is directed to provide a data obtaining system specially designed for acting as an interface between the sensors associated with an engine and a micro-processor for computing the engine parameters, either the electronic injection or ignition starting type.

The improved interface circuit employs a differential multiplexer having two differential voltage outputs and having a sign detector apparatus connected thereto. A switching block is provided which is connected between the differential voltage outputs and the voltage to frequency converter of the interface circuit as well as to the signed detector. The switching block then performs the function of a selector circuit which passes only the voltage output signals of a constant sign being output from the multiplexer to the voltage to frequency converter for ultimate processing in the microprocessor. Another feature consists of the type of analogue to digital converter contemplated according to the present invention. In fact, one of the magnitudes to be measured in an internal combustion engine is the induction air input. Now this parameter, while having an intrinsic value, is considerably more significant when the integral thereof is calculated during one or several engine revolutions; in this case, the value thus found corresponds to the amount of air present in the cylinder during the combustion, and this value is of primary importance for calculating the richness of the air/fuel mixture. If, as in the device constituting the subject-matter of this invention, a voltage/frequency converter followed by a counter is used for the analogue to digital conversion, it is possible to determine either the absolute value of a signal, by counting during a fixed predetermined time period, or the integral thereof between two moments by controlling the beginning and the end of the counting period by means of these two moments; by providing an average during a fixed or integral time period between two moments; these two measuring methods are better suited for measuring the engine parameters than any sampling operation. Another feature characterizing this invention lies in the fact that only one supply voltage is required for operating the system, so that it will perfectly adapt itself to the conditions of operation of the motor vehicle equipped with a single storage battery. Finally, a complementary and important feature characterizing the device of this invention is that the corresponding electronic circuit can easily be produced in a compact form and therefore at a relatively low cost, when the device is to be mass-produced, as usually required for devices applicable to motor vehicles.

Other features and advantages of the invention will appear as the following description proceeds with reference to the attached drawings, in which:

FIG. 3 is the wiring diagram of a typical form of embodiment of the voltage-frequency converter according to the invention, and FIG. 4 is a typical illustration of the counting element and of the bus adaptor according to this invention.

In the various figures of the drawings, the same reference numerals designate the same components.

Figure 1:
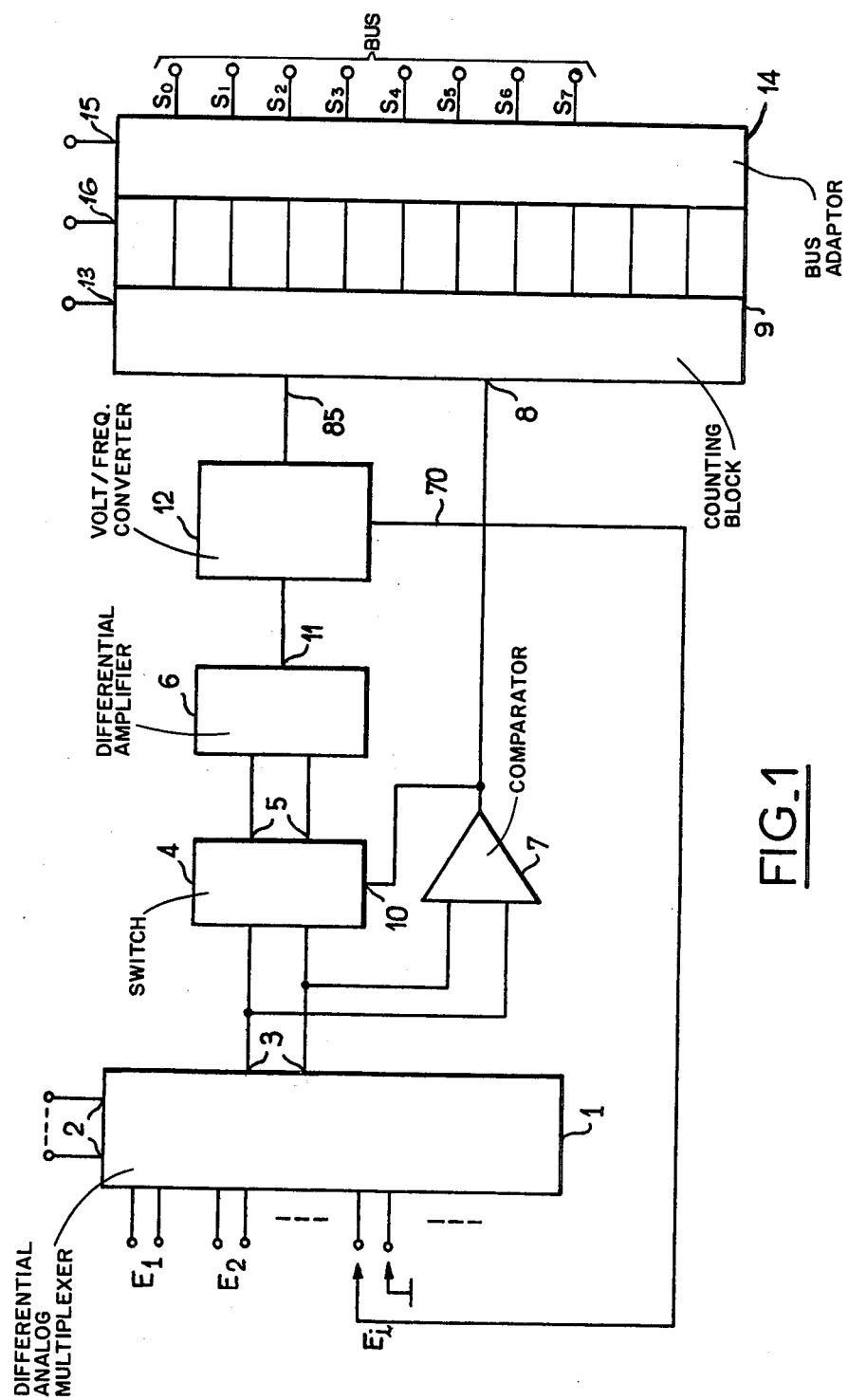
FIG. 1 is a block diagram of a device constructed according to the teachings of this invention.

FIG. 1 illustrates the block diagram of the interface analogue data obtaining modulus. A differential analogue multiplexer 1 receives at its inputs Ei, E2 ... $E_i$ the signals from analogue sensors (not shown) disposed on the engine (non shown) of the motor vehicle. This multiplexer comprises address inputs 2 and a two-wire-output 3. This output 3 is connected to the input of a switch 4 having its likewise two-wire output 5 coupled to a differential amplifier 6. Connected to the output of multiplexer 1 is a comparator 7 acting as a sign detector.

This sign detector is coupled on the one hand to the control input 8 of a counting block 9 and on the other hand to the control input 10 of a switch block 4. The output 11 of differential amplifier 6 is fed to a voltage/- frequency converter 12 having its output coupled to the clock input 85 of said counting block 9 with a control input 13. The voltage/frequency converter 12 comprises an internal reference voltage also connected to one of the inputs $E_1$ of the analogue multiplexer 1 via its output conductor 70. The ten parallel outputs of counting block 9 are connected to the ten inputs of a bus adapter 14 having its eight output wires $S_0$ to $S_7$ adapted to be connected to a microprocessor bus. Two control inputs are provided on bus adaptor 14, i.e. one control input 15 for determining the weight of the output-selected binary figures or bits, and another input 16 for validating the data on the bus.

Figure 2:
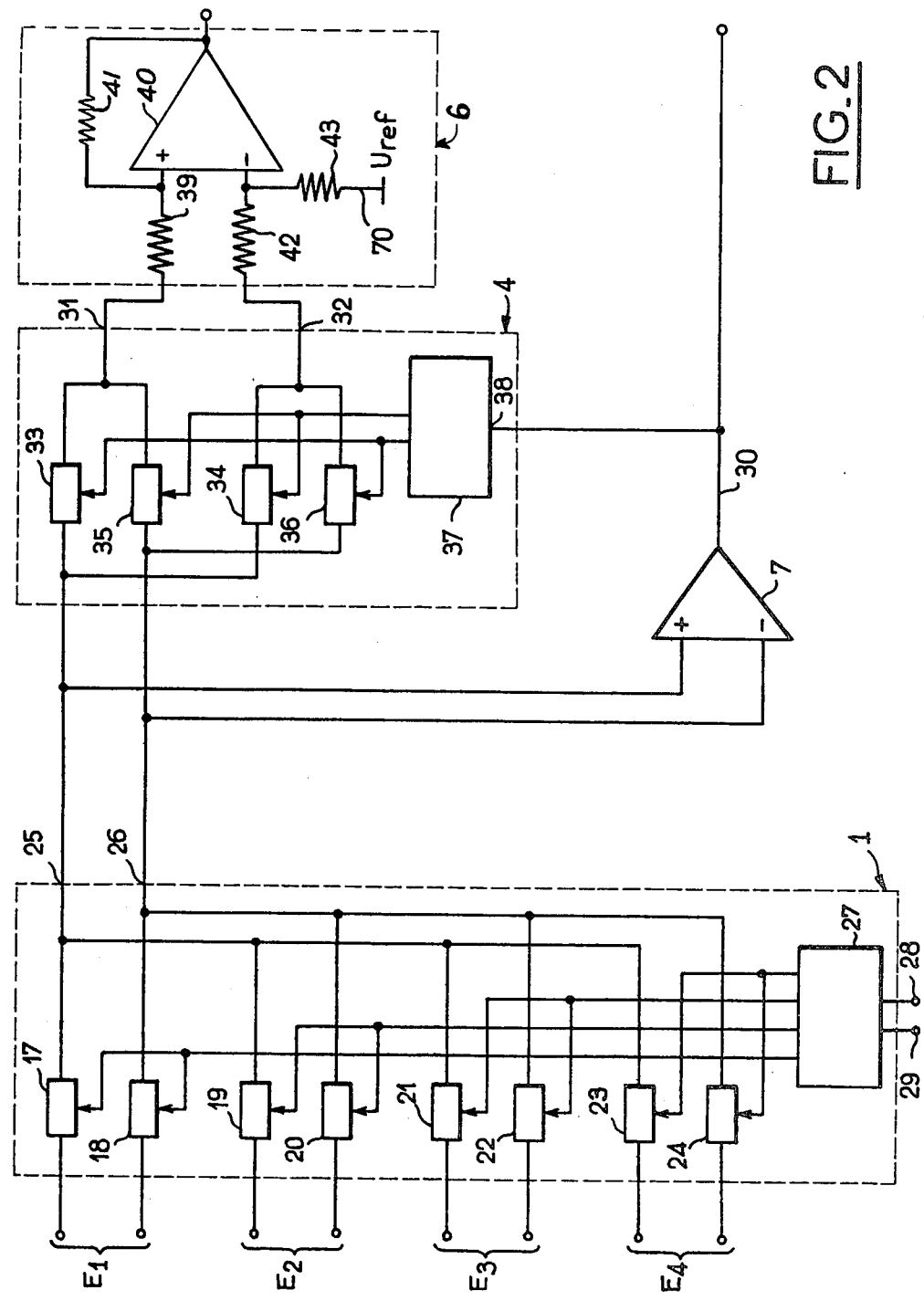
FIG. 2 illustrates more in detail the wiring diagram of the input multiplexer, of the switch, of the amplifier and of the sign detector according to this invention.

A more detailed form of embodiment of the component elements of the device will now be described with reference to FIG. 2 illustrating the assembly comprising the differential multiplexer 1, differential amplifier 6, switch 4 and comparator 7. In this figure, the blocks shown in FIG. 1 are isolated by or enclosed in a dash-line frame or rectangle and designated by the same reference numeral. The analogue multiplexer 1 which, in this description, is given by way of example, comprises four differential inputs and consists of eight analogue switches 17 to 24 connected by pairs to one of the aforesaid inputs E1 to E4.

These switches have their outputs connected to output 25 of multiplexer 1 in the case of switches 17, 19, 21 and 23, and to output 26 in the case of the other switches 18, 20, 22 and 24. On the other hand, these switches are fed by pairs from the outputs of a decoder 27 adapted to decode the signals available on its so-called address inputs 28 and 29 (corresponding to 1 and 2 of FIG. 1). The mode of operation of this multiplexer is well known to those conversant with the art: according to the specific code present at inputs 28 and 29, only one output of decoder 27 is activated and thus output 25 of multiplexer 1 is connected to one wire of one of said inputs E; the output 26 being connected to the other wire. The four inputs E can be scanned by the four binary combinations obtainable on inputs 28 and 29. Finally, this multiplexer is available in the form of integrated elements, in many different forms, notably in the circuit form CD4052 of RCA.

The comparator 7 connected to the outputs 25 and 26 of multiplexer 1 generates at its output 30 a signal equal to "one", if the signal available at its inputs is positive, and equal to zero if this signal is negative. The output 30 of comparator 7 is fed to switch block 4 having two inputs connected to the outputs 25 and 26 of multiplexer 1 and two outputs 31 and 32. Each input connected to a pair of analogue switches 33 and 34, on the one hand, 35 and 36 on the other hand. The outputs of switches 33 and 35 are interconnected to constitute the output 31 of said switch block 4, and the output of switches 34 and 36 constitute the output 32 of the same comparator. The switches are responsive to a decoder 37 so arranged that when its input 38 is at "one", the switches are in a position connecting the output 25 of multiplexer 1 to the output 31 of switch block 4 on the one hand, and the output 26 of said multiplexer is connected to the output 32 of switch block 4. When the input of decoder 37 is at "zero", the connections are reversed, that is, output 25 is connected to output 32 and output 26 to output 31. Since the signal controlling the decoder 37 actually consists of the signal obtained at the output of multiplexer 1, the output signal of switch block 4 has constantly the same polarity. The assembly comprising the components of switch block 4 is available in compact circuit form, such as circuit CD 4053 manufactured by RCA.

The output 31 of switch block 4 is connected via a resistor 39 to the reversing input of an amplifier 40 which is connected in turn to the output of the same amplifier via another resistor 41. The output 32 of switch block 4 is connected to the non-reversing input of amplifier 40 via a resistor 42 connected in turn via a resistor 43 to a voltage source Uref which delivers a reference voltage.

FIG. 3 illustrates in detail the voltage/frequency converter 12 of FIG. 1. The input voltage from differential amplifier 6 of FIG. 2 is fed to an analogue switch 44 on the one hand and to the reversing input of an amplifier 45 via a resistor 46, on the other hand. The non-reversing input of this amplifier 45 is connected to the Uref voltage source and its output is connected on the one hand to the reversing imput of the same amplifier 45 via a resistor 47 and on the other hand to a second analogue switch 48. The outputs of both switches 48 and 44 are connected via a common resistor 49 to the reversing input of another amplifier 50 mounted as an integrator by connecting a capacitor 51 between its output 52 and its reversing input. The same amplifier 50 has its non-reversing input connected to the reference voltage source Uref. The output 52 is connected to the input of a pair of voltage comparators, on the one hand to the reversing input of a comparator 53 and on the other hand to the non-reversing input of another comparator 54. A bridge comprising three resistors 55, 56 and 57 of equal values is connected between the ground and the reference voltage source Uref to provide two different voltage points, namely a voltage point 58 between resistors 55 and 56, equivalent to Uref/3, and another voltage point 59 between resistors 56 and 57, equivalent to 2 Uref/3. Point 58 is connected to the non-reversing input of comparator 53 and point 59 is connected to the reversing input of comparator 54. The output of this comparator 54 is connected to the set (to one) input 60 of a flip-flop 61, and the output of comparator 53 is connected to the reset (or zeroing) input 62 of said flip-flop 61. Both outputs Q, 63 and $\overline{Q}$, 64 are connected to the control inputs of switches 44 and 48, respectively. The other Q, 63 output also acts as an output 85 to the converter proper.

Finally, a device is provided for generating the reference voltage Uref; a current generator 65 fed with the general supply voltage $V_{al}$ delivers current to a reference Zener diode 66; this diode is connected via a resistor 67 to the non-reversing input of a follower-mounted amplifier 68, i.e. amplifier having its output 69 connected to its non-reversing input. This output 69 constitutes the Uref point available at output 70 for the other components of the data obtaining device, notably the differential amplifier 6.

This voltage/frequency converter operates as follows: in the inoperative condition flip-flop 61 is in its "1" state i.e. with switch 44 conductive and switch 48 non-conductive. Therefore, the input voltage is fed to integrator 50 of which the voltage output decreases; when this voltage has dropped to Uref/3, which is the regulation voltage of comparator 53, the latter dips and resets flip-flop 61, thus reversing the position of switches 44 and 48. Consequently, the signal fed to the input of integrator 50 is the opposite of the preceding signal, due to the presence of the voltage inverter consisting of amplifier 45 and resistors 46 and 47. The charging current of capacitor 51 is inverted and the voltage at 52 increases up to value 2 Uref/3 which is the regulation voltage of comparator 54. The latter is thus dipped, and flip-flop 61 is set to "one" again. Another complete cycle may take place. Consequently, the signal at the output Q, 63 of flip-flop 61 is a square wave signal having a period equal to twice the charging time of capacitor 51, of value $C_{51}$, between the two voltages: Uref/3 and 2 Uref/3, which time is expressed as follows:

$$T = 2 \frac{C_{51} \times (Uref/3)}{U_e} \times R_{49}$$

Let $U_e$ be the value of the input voltage and $R_{49}$ the value of resistor 49, the output frequency F equal to 1/T is actually proportional to input voltage $U_e$. This square wave signal having a frequency F acts as a clock signal for the other components of the data obtaining device.

The reference-voltage generator operates in a manner which will be obvious from a simple description to anybody conversant with the art. All the component elements of this converter are available in the form of integrated circuits.

FIG. 4 illustrates the detail of counting element 9 and bus adapter 14 of FIG. 1. An up-and-down counter 65 having 10 bits in the embodiment described herein by way of example has its outputs $C_0$ to $C_9$ connected to the relevants inputs of a memory 66. This memory has ten outputs denoted $M_0$ to $M_9$. A multiplexer 67 consists of two multiplexing elements comprising each a pair of AND gates 68, 69 on the one hand and 70, 71 on the other hand, the outputs of these gates being coupled to an OR gate 72 on the one hand and to an OR gate 73 on the other hand. The control input of this multiplexer, 74 or 15, feeds directly either of gates 71, 69 and, via an inverter 75, the other gates 70, 68. Besides, these gates receive at their other inputs the outputs of memory $M_8$ (for gate 68), $M_0$ (for gate 69), $M_9$ (for gate 70), $M_1$ (for gate 71). A series of eight "three states" gates 76 to 83 receive the output signals from the two OR gates 72 and 73 in the case of gates 76 and 77, and the signals from the memory but not multiplexed, $M_2$ to $M_7$, in the case of gates 78 to 83.

All the validation inputs of the "three states" gates 76 to 83 are connected to the validation input 84 or 16 of the output signal. The output connections of said "three states" gates 76 to 83 constitute the BUS outputs of the device, namely $S_0$ to $S_7$.

The up and down counter has a clock input 85 connected in the device to the output Q 63 or 85 of voltage/frequency converter 12, an up and down counting control input 86 or 8 connected to the output of comparator 7 and a clock validation input 87 connected on the one hand to the counting device control input (shown at 13 in FIG. 1) and on the other hand to the input of a monostable circuit 88. This monostable circuit providing a short pulse when a waveform trailing edge appears at its input feeds through its non-inverted output 89 the memorizing input of memory 66, and through its inverted output 90 the input responsive to the waveform leading edge of a second monostable circuit 91. The latter has its inverted output 92 connected to the reset input of counter 65. Upon the reset signal 92 being fed to the reset input, the counter 65 is set to an intermediate value.

This device operates as follows: when the control input 13 (FIG. 1) is set to "one", the up and down counter 65 counts up or down the pulses present at 85 according to the polarity of the signal at its input 86 or 8, i.e., depending upon the output of the sign detector 7. At the trailing edge of input signal 13 the counting is discontinued and the pulse generated by the monostable circuit 88 performs two actions: on the one hand, through its output 89, it causes the result of the counting stop to be stored in memory 66, and on the other hand it triggers the monostable 91 which, via its output 92 resets counter 65 to an intermediate value which is thus ready for performing another cycle. The "three states" output elements 76 to 83, when activated by input 84, cause the output of memory 66 to communicate with the microprocessor bus.

It is possible, by means of input 74, to select for the two low-weight binary figures $S_0$ and $S_1$ between the two low-weight binary figures $M_0$ and $M_1$ of the memory output and the two high-weights of the same word $M_8$ and $M_9$.

From the above detailed description of all the component elements of the device, the mode of operation of the assembly will be readily understood by reverting to the diagram of FIG. 1. The microprocessor, through its programme, feeds to the inputs 2 of multiplexer 1 a signal, corresponding to the selected input E1, E2 ... $E_i$, which is then fed to the inputs of switch block 4 and sign detector 7. By virtue of said switch and to the differential amplifier 6, the signal fed to the input of voltage-frequency 12 is equal to the absolute value of the selected input signal. When the up and down counter 9 is so directed, it counts up or down through its input 13 connected to the microprocessor, according to the sign of the signal at the output of sign detector 7, the frequency proportional to the absolute value of the input signal. The duration of the signal at point 13 depends of the type of measurement and is determined by the microprocessor. When the latter issues an order for stopping the counting, the monostable circuits 88 and 91 of FIG. 4 cause on the one hand the memorization of the result and on the other hand the resetting of counting circuit 65 preliminary to a subsequent measurement. The bus adapter 14 permits the converting of the result (ten binary figures in the example described herein) into several words of eight binary figures which are read successively by the microprocessor controlling on the one hand the address (input 15) selecting the word weight at the output on the bus, which under normal condition is in a high-impedance state.

If the reference voltage generator delivering a voltage to the output 70 of the voltage/frequency converter (FIG. 3) is connected to one of the analogue inputs $E_i$ of multiplexer 1 (FIG. 1), it is possible to have the value of this known value measured by the device in order to determine the gain of the device and thus make the necessary corrections and cancel any errors due to shifts in the analogue voltage as a consequence of time or temperature.

What is claimed as new is:

1. An interface circuit of the type for use between variable voltage analog sensors measuring physical magnitudes and a microprocessor for digital processing of the latter, said interface circuit comprising: an analog multiplexer connected to said sensors to select the output signals of the latter, an analog-to-digital converter including a voltage/frequency converter responsive to the output signals of said analog multiplexer and a counter for converting said frequency into digital data, and a bus adapter being provided for delivering corresponding digital data to the microprocessor, wherein said analog multiplexer comprises a differential analog multiplexer having two differential voltage outputs, and having a sign detector connected to the differential voltage outputs of said multiplexer, a switching block is interconnected between said differential voltage outputs of said multiplexer and said voltage/frequency converter, said switching block being connected to the output of said sign detector so as to act as a selector circuit transmitting each voltage output signal of said multiplexer with a constant sign to the voltage/frequency converter, and said counter being an up/down counter resettable to an intermediate value, whose up/down counting input is connected to said sign detector output for counting up or down depending on said sign detector output.

2. An interface circuit as set forth in claim 1, wherein said voltage/frequency converter comprises: an internal reference voltage generator; and means for applying this reference voltage to an input of the differential analog multiplexer to provide a self-correcting action.

3. An interface circuit as set forth in claim 1, wherein a differential amplifier is interconnected between said switching block and said voltage/frequency converter.

4. An interface circuit as set forth in claim 1, wherein said voltage/frequency converter comprises: an internal reference voltage generator; means for applying this reference voltage to an input of the differential analog multiplexer to provide a self-correcting action; a differential amplifier interconnected between said switching block and said voltage/frequency converter; and means for applying said reference voltage to the non-reversing input of said differential amplifier.

5. An interface circuit as set forth in claim 1, wherein said voltage/frequency converter comprises an internal reference voltage generator and an operational amplifier mounted as an integrator with a capacitor and charge and discharge control means of the latter responsive to two voltage levels which are derived from said reference voltage.

6. An interface circuit as set forth in claim 5, wherein a differential amplifier is interconnected between said switching block and said voltage/frequency converter, said operational amplifier mounted as an integrator being connected to the output of said differential amplifier via its reversing input, by means of a pair of analog switches mounted in parallel, one of which being in series with polarity inverting means, and via its non-reversing input to said reference voltage generator, the output of said operational amplifier being connected in parallel with the non-reversing input of a first comparator constituted by a differential amplifier and with the reversing input of a second comparator constituted by a differential amplifier, said first and second comparators having their outputs respectively connected to the set and reset inputs of a flip-flop, of which both outputs are respectively connected to the control inputs of said pair of analog switches, the reversing input of said first comparator being responsive to said second voltage level and the non-reversing input of said second comparator being responsive to said first voltage level, whereby said first and second comparators, said flip-flop and said pair of analog switches constitute said charge and discharge control means of said capacitor.

7. An interface circuit as set forth in claim 5, wherein the internal reference voltage generator comprises in series in a supply line a current generator and a Zener diode having a common point connected to the non-reversing input of an operational amplifier mounted as a follower and having its output connected to the non-reversing input of said differential amplifier interconnected between said switching block and said voltage/frequency converter.

8. An interface circuit as set forth in claim 1, wherein the up/down counter has its clock input connected to the output of the voltage/frequency converter and its up/down counting input connected to the output of said sign detector and is furthermore connected via its outputs in parallel to corresponding inputs of a memory, a first monostable circuit responsive to the negative going edge of the clock validation signal of said up/down counter having its non-reversing output connected to the memorization input of said memory and its reversing output connected to a second monostable circuit responsive to the positive going edge of the signal emitted by said reversing output, said second monostable circuit having its reversing output connected to the reset input of said up/down counter.

9. A interface circuit as set forth in claim 8, wherein said bus adapter comprises a series of three state gates related to the number of conductors comprised in the bus, one portion of said gates being connected directly in parallel to an equal number of outputs of said memory, and a second portion of said gates being selectively connected to a higher number of other outputs of said memory via a multiplexer.

* * * * *